US009385468B2

(12) United States Patent
Lee

(10) Patent No.: US 9,385,468 B2
(45) Date of Patent: Jul. 5, 2016

(54) JOINT CONNECTOR ASSEMBLY

(75) Inventor: Chul-Sub Lee, Daegu (KR)

(73) Assignee: Tyco Electronics Amp Korea Ltd., Kyungsangbuk-Do (KR)

( * ) Notice: Subject to any disclaimer, the term of this patent is extended or adjusted under 35 U.S.C. 154(b) by 0 days.

(21) Appl. No.: 13/566,238

(22) Filed: Aug. 3, 2012

(65) Prior Publication Data

US 2013/0005161 A1 Jan. 3, 2013

Related U.S. Application Data

(63) Continuation of application No. PCT/KR2011/000109, filed on Jan. 7, 2011.

(30) Foreign Application Priority Data

Feb. 22, 2010 (KR) ........................ 10-2010-0015746

(51) Int. Cl.

| | |
|---|---|
| ***H01R 12/00*** | (2006.01) |
| ***H05K 1/00*** | (2006.01) |
| ***H01R 13/514*** | (2006.01) |
| ***H01R 12/71*** | (2011.01) |
| *H01R 13/629* | (2006.01) |
| *H01R 13/66* | (2006.01) |

(52) U.S. Cl.

CPC ............ *H01R 13/514* (2013.01); *H01R 12/716* (2013.01); *H01R 13/62944* (2013.01); *H01R 13/6658* (2013.01); *H01R 2201/26* (2013.01)

(58) Field of Classification Search

CPC .................................. H01R 12/00; H05K 1/00

USPC ............... 439/76.2, 76.1, 157, 372, 723, 640, 439/645, 652, 654, 656, 713, 721; 174/50, 174/59, 260, 261; 361/600, 641, 788, 785, 361/760

See application file for complete search history.

(56) References Cited

U.S. PATENT DOCUMENTS 4,703,394 A * 10/1987 Petit et al. ..................... 361/790
4,940,419 A * 7/1990 Kurita et al. .................. 439/271

(Continued)

FOREIGN PATENT DOCUMENTS

| | | | |
|---|---|---|---|
| EP | 2009747 | A1 | 12/2008 |
| JP | 2003123918 | A | 4/2003 |
| JP | 2004-311223 | A | 11/2004 |
| JP | 2007-242559 | A | 9/2007 |
| JP | 2007335095 | A | 12/2007 |
| WO | 2009128378 | A1 | 10/2009 |

OTHER PUBLICATIONS

PCT Report, International Publication No. WO 2011/102602 A3, Publication date Aug. 25, 2011, 3 pages.
European Patent Office Search Report, Application No. 11744844. 9-1801, dated Aug. 25, 2014, 7 pages.

*Primary Examiner* — Abdullah Riyami
*Assistant Examiner* — Harshad Patel
(74) *Attorney, Agent, or Firm* — Barley Snyder

(57) ABSTRACT

The invention relates to a joint connector assembly including first and second connectors connected to each other by a circuit board and connected to third connectors by connection terminals. The circuit board is mounted at the center of the third connectors below the first and second connectors located in an upper region of a main body housing and is integrally formed with the main body housing in a lower region thereof. The upper region of the main body housing defines first and second connector receptacles for the first and second connectors. A cover member is attached to a lower surface of the circuit board to cover the circuit board. The joint connector assembly has a reduced volume because the connectors are connected to one another without lines and all the connectors are inserted in the main body housing, allowing the joint connector assembly to be installed in a small space.

14 Claims, 9 Drawing Sheets

(56) References Cited

U.S. PATENT DOCUMENTS

| | | | | |
|---|---|---|---|---|
| 5,279,506 | A * | 1/1994 | Kawase et al. | 439/157 |
| 6,870,096 | B2 * | 3/2005 | Suzuki et al. | 174/50 |
| 7,125,285 | B2 | 10/2006 | Maejima | |
| 7,485,012 | B2 * | 2/2009 | Daugherty et al. | 439/701 |
| 7,537,481 | B2 * | 5/2009 | Sano et al. | 439/527 |
| 2003/0040224 | A1 | 2/2003 | Fujii et al. | |
| 2005/0142905 | A1 | 6/2005 | Maejima et al. | |

* cited by examiner

JOINT CONNECTOR ASSEMBLY

CROSS-REFERENCE TO RELATED APPLICATIONS

This application is a continuation of PCT International Application No. PCT/KR2011/000109 filed Jan 7, 2011, which claims priority under 35 U.S.C. §119 to Korean Patent Application No. 10-2010-0015746 filed on Feb. 22, 2010.

FIELD OF THE INVENTION

The present invention relates to joint connectors, and more particularly, to a joint connector assembly in which a plurality of connectors are electrically connected to one another via direct contact of a circuit board as well as connection terminals, rather than using a plurality of connection lines, and all of these constituent elements are mounted to a main body housing.

BACKGROUND

A connector has been widely used, for example, in a power circuit of a washing machine, refrigerator, vehicle or the like. In general, it is comprised of a connector housing and a connection terminal. When a connector is applied to electric and electronic appliances, it is possible to previously assemble a number of individual elements with one another and thereafter, insert the resulting assembly into a final product, which results in considerably simplified maintenance and repair as well as manufacture of the aforementioned appliances. In the case where it is desired to couple one connector to the other connector, terminals provided respectively at both connectors should be electrically connected. Here, one might consider providing one connector with a plurality of terminals and the other connector with a busbar type terminal connected to the plurality of terminals in series. The connectors as described above are referred to as joint connectors. The joint connectors serve to electrically connect a variety of constituent elements with one another in electronic products.

In a concrete example in relation to a connector usable with a vehicle, referring to FIG. 8A, a plurality of power lines are installed toward front and rear sides and left and right sides of a vehicle body frame panel 700 and are connected to constituent elements of the vehicle by a connector mechanism 710. For example, the plurality of power lines may include an engine line 721 connected to an engine installed at a front region of the vehicle, an air conditioner line 723 connected to air conditioners installed at left and right regions of the vehicle, and a sound line 725 connected to a sound system installed at a rear region of the vehicle.

The connector mechanism 710, as described above, includes first, second and third connectors 711, 713 and 715 connected respectively to the aforementioned lines 721, 723 and 725. The first, second and third connectors 711, 713 and 715 are respectively provided with first, second and third connector lines 711', 713'and 715' to connect the respective connectors 711, 713 and 715 with one another.

Referring to FIG. 8B, the connector mechanism 710 is installed to one surface of the vehicle body frame panel 700 of the vehicle by being inserted through an installation hole 701 perforated in the vehicle body frame panel 700.

In the above described configuration, a variety of the power lines 721, 723 and 725 connected to front and rear regions of the vehicle have a significantly complicated arrangement within a limited and narrow space of the vehicle, which results in deterioration in the assembly efficiency of the connectors and the lines.

Furthermore, when the connector mechanism is installed using tools, the variety of lines may be damaged by coming into frictional contact with the tools, or by being folded to one side to provide a space required for manipulation of the tools.

In addition, since the plurality of lines should be installed at the same place and be bent sharply due to structural restrictions of the vehicle, damage to the lines due to arrangement fatigue is inevitable.

Installing the plurality of lines at the same place, moreover, worsens damage due to frictional contact between the lines.

In the meantime, as illustrated in FIG. 8B, the connector 710 should be inserted through the installation hole 701 perforated in the vehicle body frame panel 700 with necessitates a separate member for covering the installation hole 701, thereby causing an increase in the number of installation processes and deteriorating the strength of the vehicle body frame panel 700.

SUMMARY

The invention is related to a joint connector assembly having first, second and third connectors. The first and second connectors are connected to each other by a circuit board. The third connectors is located adjacent to the first and second connectors and directly connected respectively to the first and second connectors by connection terminals.

BRIEF DESCRIPTION OF THE DRAWINGS

The invention is described in more detail below with reference to the embodiments shown in the drawings. Similar or corresponding details in the Figures are provided with the same reference numerals. The invention will be described in detail with reference to the following figures of which.

DETAILED DESCRIPTION OF THE EMBODIMENT(S)

Figure 1:
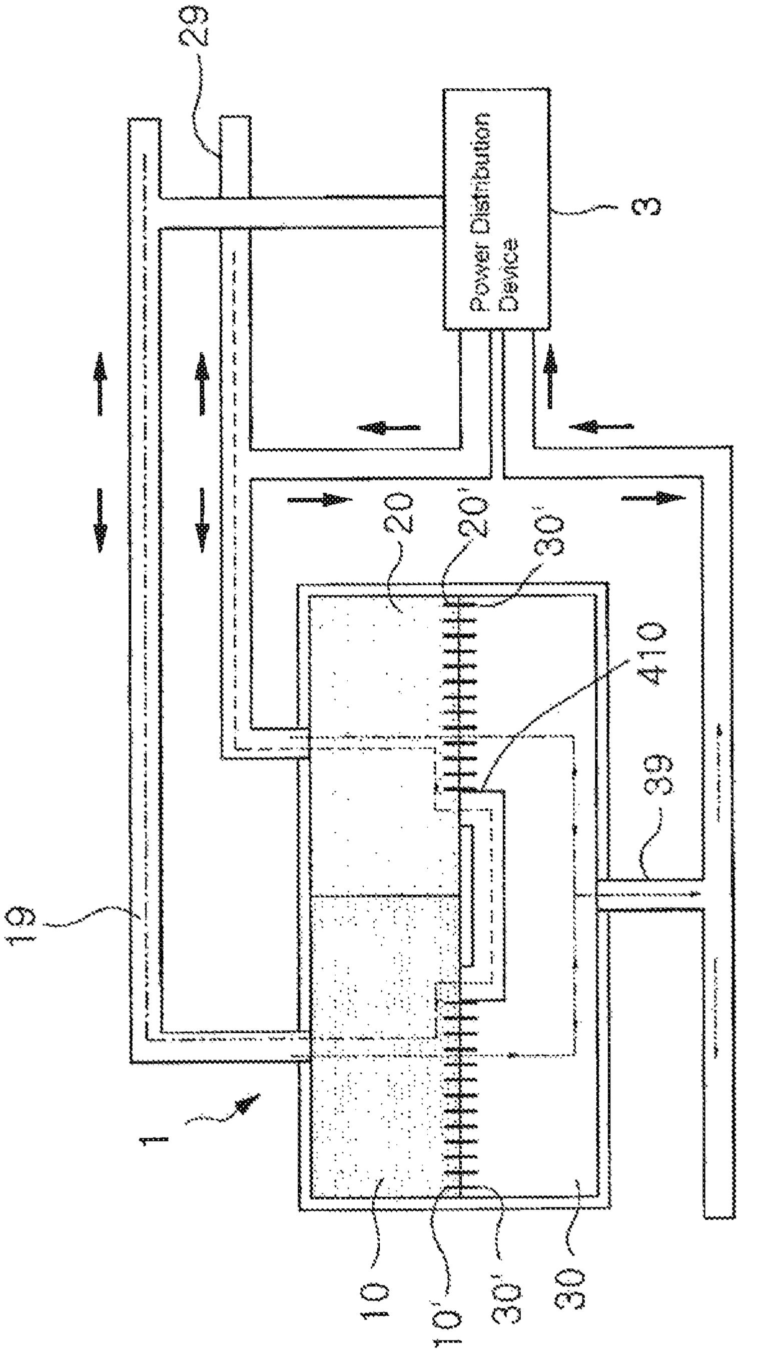
FIG. 1 is a view schematically illustrating electrical connection of joint connectors.

One aspect of the present invention provides a joint connector assembly including first and second connectors connected to each other by a circuit board, and third connectors located adjacent to the first and second connectors and directly connected respectively to the first and second connectors by connection terminals.

The circuit board may be located below the first and second connectors and may be mounted on the third connectors.

The first and second connectors may be located in an upper region of a main body housing and the third connector may be integrally formed with the main body housing so as to be located in a lower region of the main body housing, the upper region of the main body housing may define first and second connector receptacles in which the first and second connectors are installed respectively, and the circuit board may be mounted at the center of the third connectors below the first and second connectors and a cover member may be attached to a lower surface of the circuit board so as to cover the circuit board.

The main body housing may be provided with a connector coupling unit, which serves to insert the first and second connectors into the first and second connector receptacles so as to allow the first and second connectors to be coupled to the respective third connectors.

The connector coupling unit may include sliding members provided at both lateral sides of the main body housing and having protrusions formed at upper ends thereof so as to be inserted into recesses formed in both lateral ends of the first and second connectors, the sliding members serving to insert the first and second connectors into the upper region of the main body housing, and a lever member having both ends engaged with lower ends of the respective sliding members and adapted to be pivoted upward from a front surface of the main body housing.

The lower ends of the sliding members may be provided with linear toothed portions and both the ends of the lever member may be provided with circular toothed portions to be engaged with the linear toothed portions respectively.

The main body housing may be provided at a rear surface thereof with a mounting surface coupling structure to allow the main body housing to be coupled to a mounting surface of a vehicle body frame.

The mounting surface coupling structure may include a coupling guide formed at the rear surface of the main body housing, and a bracket having a coupling rail, into which the coupling guide is inserted, and a vehicle body frame coupling piece to be coupled to the mounting surface of the vehicle chassis.

The mounting surface coupling structure may include a vehicle body frame coupling piece formed at the rear surface of the main body housing to allow the main body housing to be directly coupled to the mounting surface of the vehicle body frame.

In a joint connector assembly according to the present invention, first, second and third connectors thereof are connected to one another by a circuit board as well as connection terminals, which results in a reduction in the volume of the joint connector assembly.

According to the present invention, further, the first and second connectors are received in a main body housing and in particular, the third connectors are integrally formed with the main body housing, which allows the joint connector assembly to be installed in a small space.

Further, as the connection terminals of the third connectors are directly connected to the connection terminals of the first and second connectors and the first and second connectors are connected to each other by the circuit board, there is no need for additional lines to connect the respective connectors to one another, which results in a simplified configuration of the joint connector assembly.

Furthermore, as the first and second connectors received in an upper region of the main body housing are connected respectively to the third connectors received in a lower region of the main body housing, it is possible to prevent damage to the lines connected to the respective connectors due to sharp bending of the lines even if the lines are connected to individual front and rear regions of a target object.

The present invention provides a connector coupling unit, which can serve to couple the first and second connectors to the main body housing while allowing the connection terminals to realize simultaneous electrical connection of the plurality of connectors without a risk of electrical interference.

In addition, the main body housing in which the joint connectors are arranged is coupled to a mounting surface coupling unit to be coupled to a target mounting surface. This may eliminate a need for an installation hole that has been conventionally perforated in the target mounting surface of a vehicle body frame, thereby allowing the main body housing to be simply installed in any kind of vehicle without a reduction in the durability of the vehicle body frame.

Hereinafter, an exemplary embodiment of the present invention will be described in more detail with reference to the accompanying drawings.

As illustrated in FIGS. 1-4, joint connectors of the present invention include a plurality of connectors, for example, a first connector 10, a second connector 20 and third connectors 30, which are electrically connected to one another. The first connector 10 and one of the third connectors 30 are directly connected to each other via a first connection terminal 10' and one third connection terminal 30' thereof. Similarly, the second connector 20 and the other third connector 30 are directly connected to each other via a second connection terminal 20' and the third connection terminal 30 thereof. Also, the first connector 10 and the second connector 20 are connected to each other by circuit board connection terminals 411 of a circuit board 410.

For example, power distributed from a power distribution device 3 is transmitted to the third connectors 30 through the first connector 10 and the second connector 20. The power may also be transmitted from the first connector 10 to the second connector 20 through the circuit board 410. The power transmission path through the first, second and third connectors 10, 20 and 30 may be set in various manners based on the type of signal to be transmitted.

Figure 2:
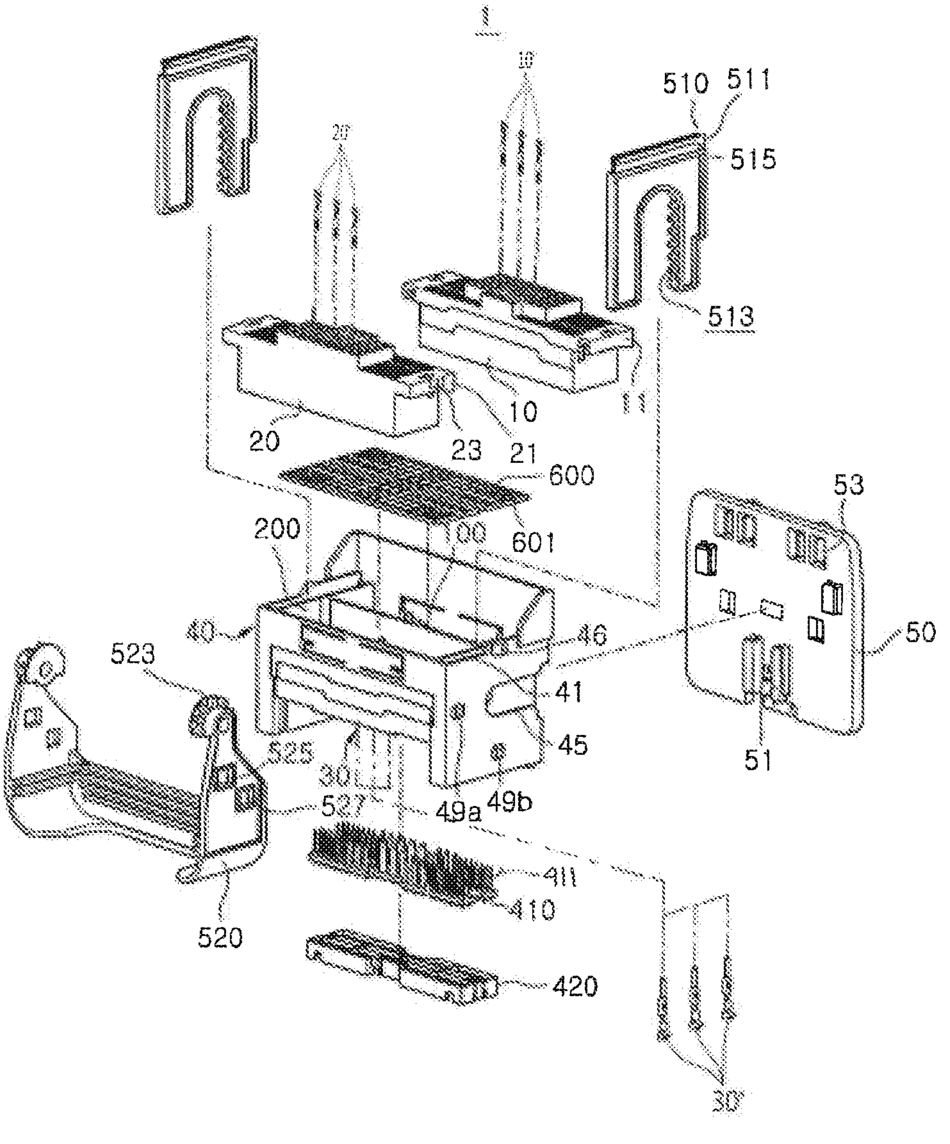
FIG. 2 is an exploded perspective view of a joint connector assembly.

The joint connectors 10, 20 and 30 as described above constitute a joint connector assembly as illustrated in FIG. 2.

The joint connector assembly is comprised of a main body housing 40 in which the first and second connectors 10 and 20 are arranged in an upper region and the third connectors 30 are arranged in a lower region, the third connectors 30 being integrally formed with the main body housing 40, and the circuit board 410 mounted at the center of the third connectors 30 and serving to connect the first connector 10 and the second connector 20 to each other.

The main body housing 40 internally defines first and second connector receptacles 100 and 200 in the upper region thereof for insertion of the first and second connectors 10 and 20. The third connectors 30 are located at the center of the main body housing 40 to vertically divide the main body housing 40 into upper and lower regions.

Figure 3:
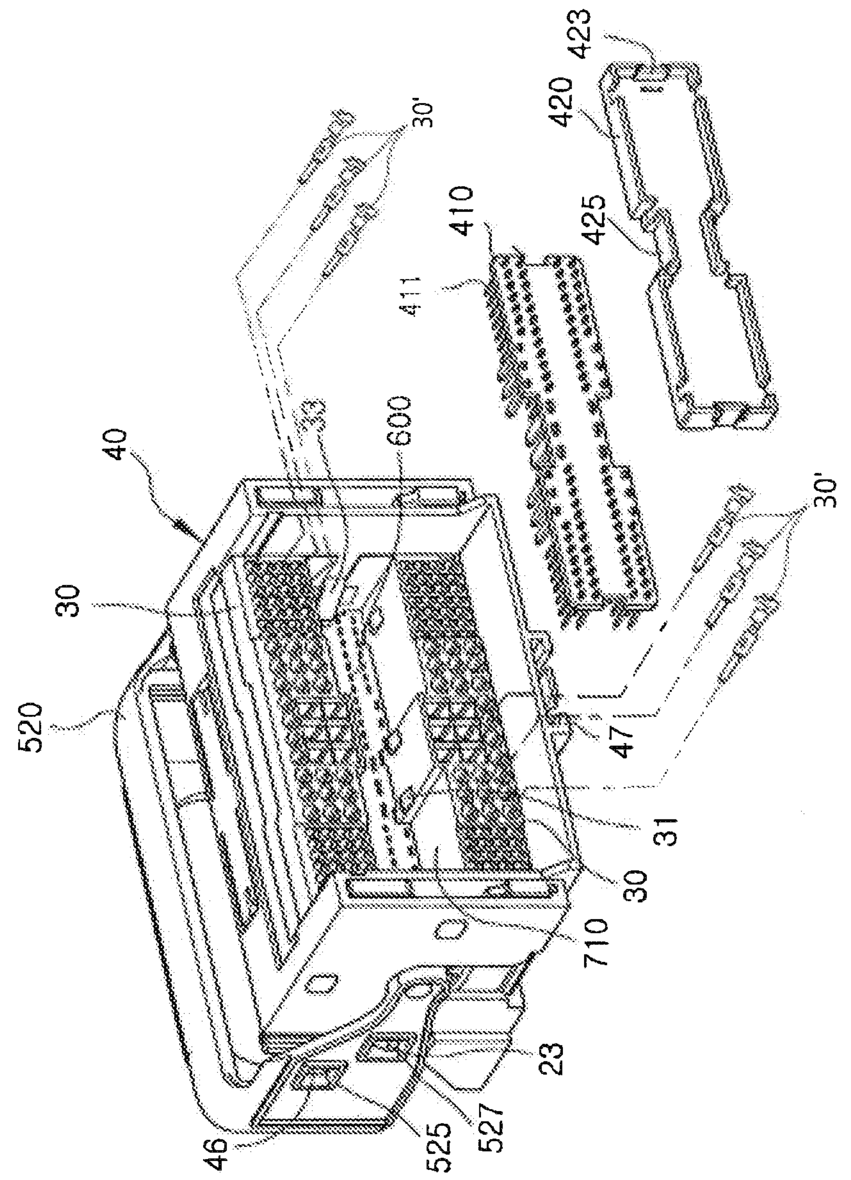
FIG. 3 is an exploded perspective view illustrating a coupling relationship of a circuit board and a cover member included in the joint connector assembly.

As illustrated in FIG. 3, the third connectors 30 are located close to the bottom of the first and second connectors 10 and 20 and are arranged separately at front and rear locations of the main body housing 40. The circuit board 410 is inserted and secured between the separated third connectors 30, i.e. to the center of the third connectors 30.

Preferably, a cover member 420 is further attached to a lower surface of the circuit board 410 and serves to prevent the connection terminals 10', 20' and 30' of the first, second and third connectors 10, 20 and 30 from electrically interfering with the circuit board connection terminals 411 of the circuit board 410.

The third connectors 30, which come into contact with the circuit board 410 inserted therebetween, are provided with coupling protrusions 31 and 33. The coupling protrusions 31 and 33 are used to secure the cover member 420. The cover member 420 to cover the lower surface of the circuit board 410 is provided with coupling recesses 423 and 425 corresponding to the coupling protrusions 31 and 33. In this case, it will naturally be understood that the circuit board 410 may also have coupling recesses similar to the cover member 420 for the sake of coupling with the third connectors 30.

Referring again to FIG. 2, a terminal protecting member 600 is mounted in the main body housing 40. The terminal protecting member 600 serves to prevent the first, second and third connection terminals 10', 20'and 30' of the first, second and third connectors 10, 20 and 30 and the circuit board connection terminals 411 of the circuit board 410 from bending upon insertion, resulting in damage thereto.

Considering the role of the terminal protecting member 600 in more detail, the connection terminals protruding outward from the respective connectors have risk of being bent upon mounting of the respective connectors or when the connectors are grounded for electrical connection therebetween. The terminal protecting member 600 has a plurality of holes 601 perforated at positions corresponding to insertion positions of the first, second and third connection terminals 10', 20' and 30' of the first, second and third connectors 10, 20 and 30 and the circuit board connection terminals 411 of the circuit board 410. Accordingly, as the respective connection terminals are inserted into the holes 601 when the connectors are mounted or grounded, the terminal protecting member 600 can protect the connection terminals without the risk of bending.

The main body housing 40 is further provided with a connector coupling unit 500. The connector coupling unit 500 serves to couple the first and second connectors 10 and 20 inserted in the first and second connector receptacles 100 and 200 to the third connectors 30 integrally formed with the lower region of the main body housing 40.

The connector coupling unit 500 includes sliding members 510 and a lever member 520. The sliding members 510 are provided respectively at opposite sides of the first and second connector receptacles 100 and 200. The lever member 520 is adapted to be pivoted in linkage with the sliding members 510, thereby serving to insert the first and second connectors 10 and 20 into the first and second connector receptacles 100 and 200.

The sliding members 510 are inserted in sliding member receiving grooves 41 defined in both lateral sides of the main body housing 40 and lower ends of the sliding members 510 are exposed to the outside of the main body housing 40 through slits 45 cut in the bottom of the main body housing 40 immediately below the respective sliding member receiving grooves 41.

The sliding members 510 are coupling members linked to the lever member 520 and serve to insert the first and second connectors 10 and 20 into the first and second connector receptacles 100 and 200 by being moved downward by the lever member 520. The sliding members 510 are provided at upper ends thereof with protrusions 511, and the first connector 10 and the second connector 20 are provided at opposite ends thereof with recesses 11 and 21 corresponding to the protrusions 511 of the sliding members 510, the recesses 11 and 21 being configured to surround the protrusions 511. Once the protrusions 511 of the sliding members 510 are completely inserted into the recesses 11 and 21 of the first and second connectors 10 and 20, the sliding members 510 are coupled to the first and second connectors 10 and 20.

To allow the first and second connectors 10 and 20 to be easily fitted to the protrusions 511 of the sliding members 510, as illustrated in FIG. 2, an entrance of each of the recesses 11 and 21, where the protrusion 511 begins to be inserted, may be larger than the protrusion 511.

More specifically, the entrance of the recess 11 is configured such that a lower end thereof is wider than that of the protrusion 511, but the width of the recess 11 is gradually reduced in an insertion direction of the protrusion 511 so as to be equal to that of the protrusion 511.

In the above described configuration, to prevent the first connector 10 from being unintentionally moved due to a gap between the recess 11 and the protrusion 511 because the entrance of the recess 11 is larger than the protrusion 511, the protrusion 511 is provided, at a position thereof corresponding to the entrance of the recess 11 fitted to the protrusion 511, with an insert line 515. Preferably, the insert line 515 has a shape corresponding to that of the entrance of the recess 11, thereby serving to eliminate the presence of a gap between the first connector 10 and the sliding member 510 by being coupled to the entrance of the recess 11 of the first connector 10 even through the recess 11 is larger than the protrusion 511.

Each of the sliding members 510 is provided at a lower portion thereof with a linear toothed portion 513. The linear toothed portion 513 is exposed to the outside of the main body housing 40 through the corresponding slit 45 of the main body housing 40.

The lever member 520 has a U-shaped form and is provided respectively at both left and right ends thereof with circular toothed portions 523 corresponding to the linear toothed portions 513 of the respective sliding members 510.

The circular toothed portions 523 of the lever member 520 are configured to be engaged with the linear toothed portions 513 which are formed at the lower portions of the sliding members 510 and are exposed to the outside through the slits 45 of the main body housing 40. Thus, as the lever member 520 is pivoted, the sliding members 510, linked to the lever member 520 via engagement of the linear toothed portions 513 and the circular toothed portions 523, slide downward of the main body housing 40.

Here, considering the sequence of coupling the first connector 10 and the second connector 20 to the upper ends of the sliding members 510, the first connector 10 is first fitted to the protrusions 511 so as to be coupled to a rear end of the main body housing 40 and thereafter, the second connector 20 is fitted to the protrusions 511 so as to be coupled to a front end of the main body housing 40.

The lever member 520 is provided at both lateral sides thereof with first and second pivoting restraining holes 525 and 527, to restrict a pivoting radius of the lever member 520. The second connector 20 is provided at both lateral sides thereof with first pivoting restraining bosses 23 to be inserted into the first pivoting restraining holes 525 and the main body housing 40 is provided at both lateral sides thereof with second pivoting restraining bosses 46 to be inserted into the second pivoting restraining holes 527 when the lever member 520 is pivoted upward. Here, the first pivoting restraining bosses 23 are formed at specific portions of the second connector 20 secured to outer surfaces of the respective sliding member 510.

The main body housing 40 is further provided at upper and lower positions of both lateral sides thereof with first and second pivoting preventing bosses 49*a* and 49*b*, to prevent pivoting of the lever member 520. Specifically, a pair of the first and second pivoting preventing bosses 49*a* and 49*b* function to catch either lateral side of the lever member 520 to prevent the lever member 520, which has been kept at a downwardly pivoted position, from being unintentionally pivoted upward. Thus, the first and second pivoting preventing bosses 49*a* and 49*b* can function to support either lateral side of the lever member 520 without a risk of pivoting when external force is not applied thereto. However, if a user applies external force to pivot the lever member 520 when it is desired to couple the first and second connectors 10 and 20 to the third connectors 30, the lever member 520 can be pivoted upward by passing through the first pivoting preventing bosses 49*a*.

In this way, the lever member 520, which has been pivoted downward to a front surface of the main body housing 40 in order to move the sliding members 510 downward, is able to be pivoted upward until the first and second pivoting restraining holes 525 and 527 of the lever member 520 are inserted into the first pivoting restraining bosses 23 of the second connector 20 and the second pivoting restraining bosses 46 of the main body housing 40.

In the meantime, the main body housing 40 is provided at a rear surface thereof with a mounting surface coupling structure, which serves to couple the main body housing 40 to a target mounting surface of a vehicle body frame.

The mounting surface coupling structure may include a coupling guide 47 provided at the rear surface of the main body housing 40 and a bracket 50 having coupling rails 51 into which the coupling guide 47 is slidably inserted such that the bracket 50 is coupled to the main body housing 40. The bracket 50 further has a plurality of coupling pieces 53 protruding from a rear surface thereof. As the coupling pieces 53 are tightly inserted into small coupling holes perforated in the mounting surface of the vehicle body frame, the bracket 50 is coupled to the vehicle body frame.

Thus, the bracket 50 is coupled at one side thereof with the rear surface of the main body housing 40 and at the other side thereof with the mounting surface of the vehicle body frame, thereby serving to couple the main body housing 40 with the vehicle body frame.

Although not illustrated in the drawings, alternatively, to allow the main body housing 40 to be directly coupled with the vehicle body frame without the bracket 50, the coupling pieces 53 to be inserted into the small coupling holes of the vehicle body frame may be provided at the rear surface of the main body housing 40, or the coupling rails 51 into which the coupling guide 47 of the main body housing 40 is inserted may be provided at the mounting surface of the vehicle body frame.

Hereinafter, the coupling sequence of the first, second and third connectors of the joint connector assembly having the above described configuration will be described in detail.

As clearly shown in the embodiments of FIGS 1-4, the circuit board 410 is mounted at the center of the third connectors 30 integrally formed with the main body housing 40, to allow the first and second connection terminals 10' and 20' of the first and second connectors 10 and 20 to be connected to the circuit board connection terminals 411 of the circuit board 410. In this case, it will naturally be understood that the first connection terminal 10' of the first connector 10 is also connected to the third connection terminal 30' of the corresponding third connector 30 and the second connection terminal 20' of the second connector 20 is also connected to the third connection terminal 30' of the corresponding third connector 30.

The cover member 420 is attached to the lower surface of the circuit board 410 as the coupling recesses 423 and 425 of the cover member 420 are inserted on the coupling protrusions 31 and 33 of the third connector 30. The cover member 420 functions to prevent the circuit board connection terminals 411 of the circuit board 410 from electrically interfering with the third connection terminals 30' of the third connectors 30.

In addition, the terminal protecting member 600 is inserted into the main body housing 40 from the top side so as to be located above the third connectors 30 and the circuit board 410.

Figure 4:
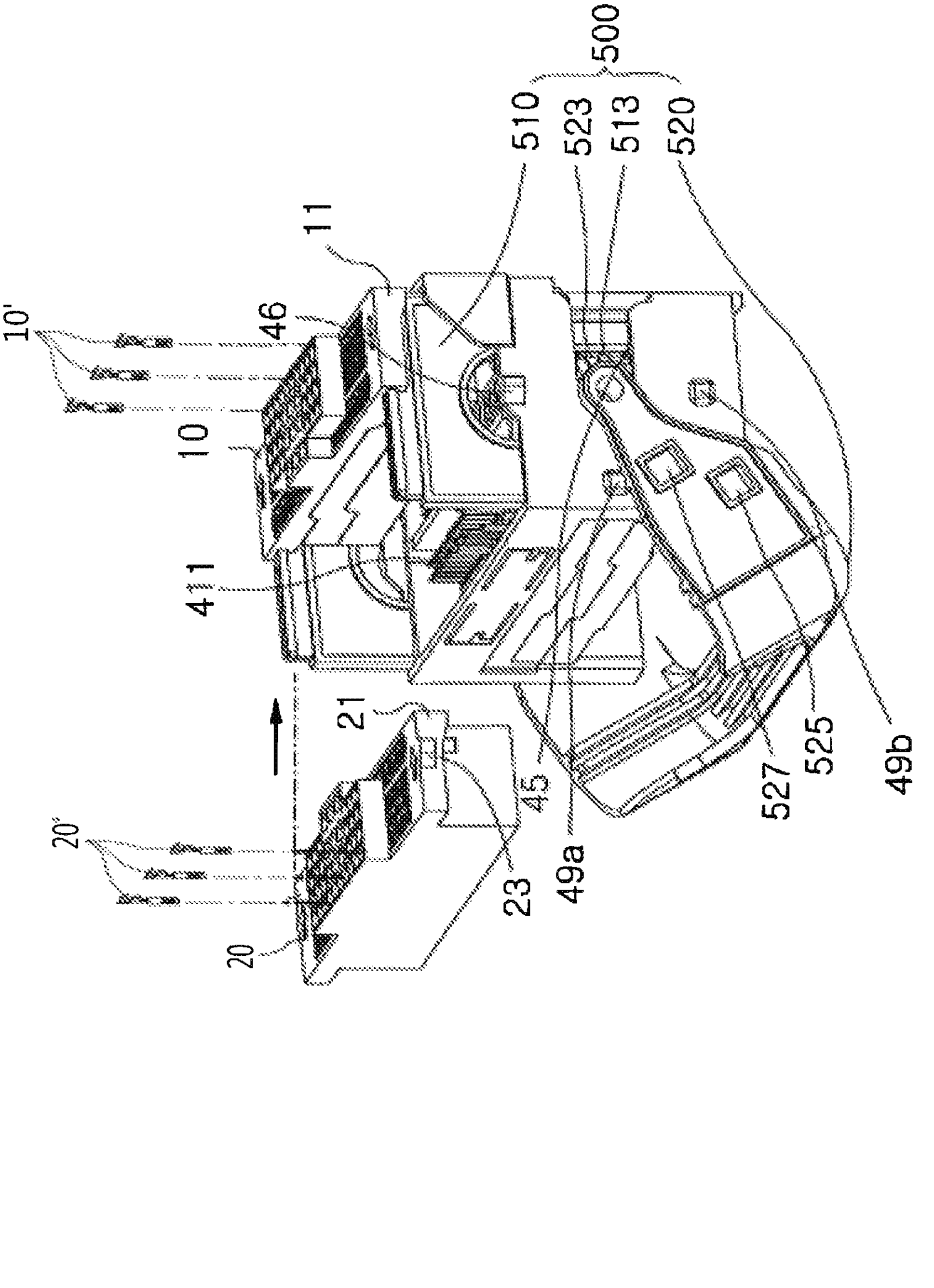
FIG. 4 is a perspective view illustrating a state in which a first connector is coupled to a main body housing of the joint connector assembly.

Next, as illustrated in FIG. 4, the recesses 11 formed at both lateral sides of the first connector 10 are fitted to the protrusions 511 of the sliding members 510 inserted in both lateral sides of the main body housing 40. In this case, the entrances of the recesses 11 are larger than the protrusions 511 to enable easy installation of the first connector 10. Once the recesses 11 of the first connector 10 are fitted to the protrusions 511, the insert lines 515 formed at specific positions of the protrusions 511 are closely coupled with the recesses 11, thereby eliminating the presence of a gap between the protrusions 511 and the recesses 11.

Figure 5:
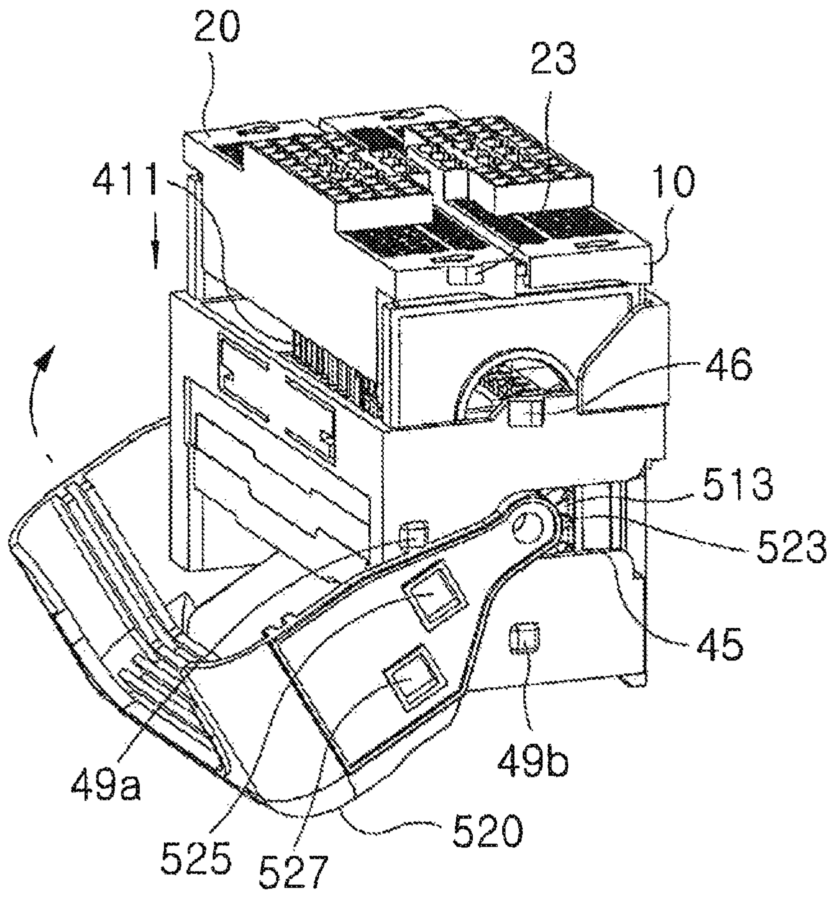
FIG. 5 is a perspective view illustrating a state in which first and second connectors are coupled to the main body housing of the joint connector assembly.

Next, referring to FIG. 5, similar to the first connector 10, the recesses 21 formed at both lateral sides of the second connector 20 are fitted to front ends of the protrusions 511 of the sliding members 510.

In this case, the first and second connectors 10 and 20 are seated at the top of the first and second connector receptacles 100 and 200 with a predetermined distance therebetween, rather than being inserted into the first and second connector receptacles 100 and 200.

Figure 6:
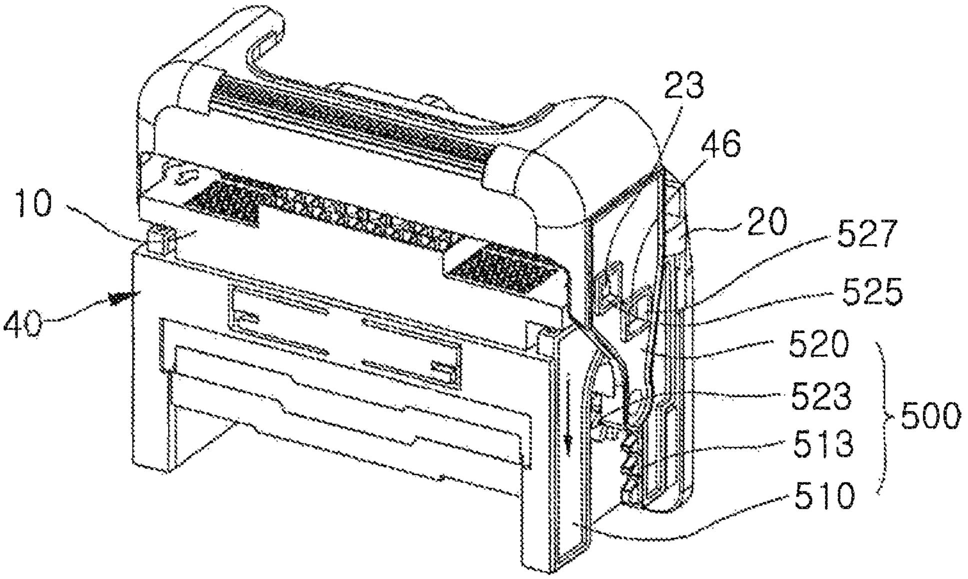
FIG. 6 is a perspective view illustrating a state in which a lever member of the joint connector assembly according to the present invention is pivoted to completely couple the first and second connectors.
Figure 7:
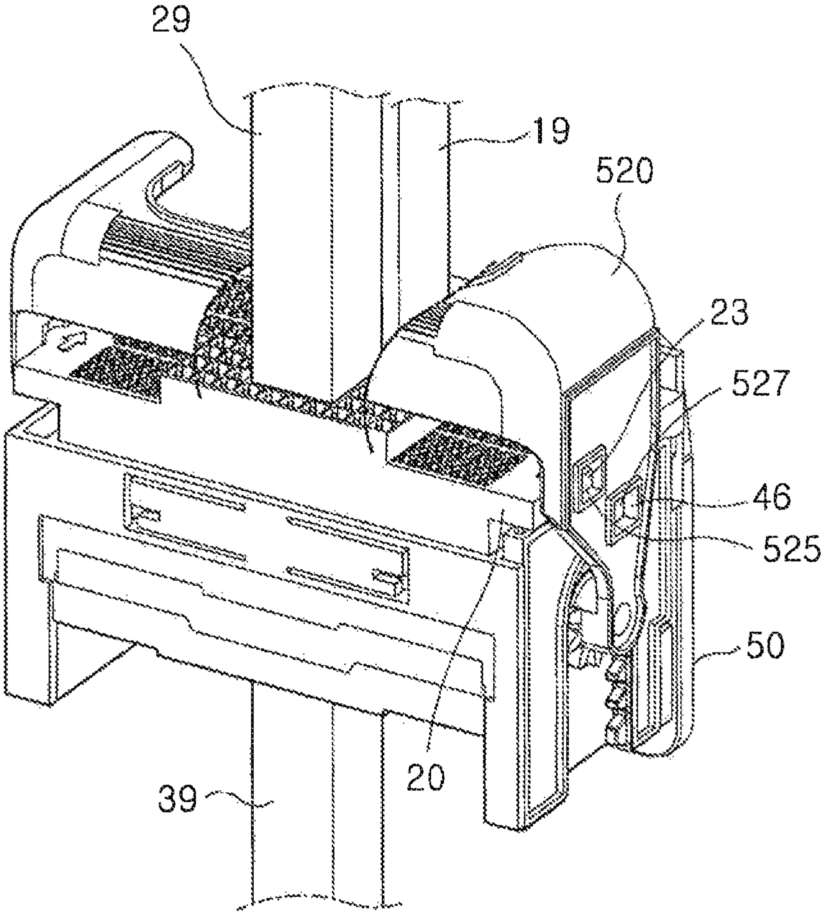
FIG. 7 is a perspective view illustrating lines connected to the joint connector assembly.
Figure 8A:
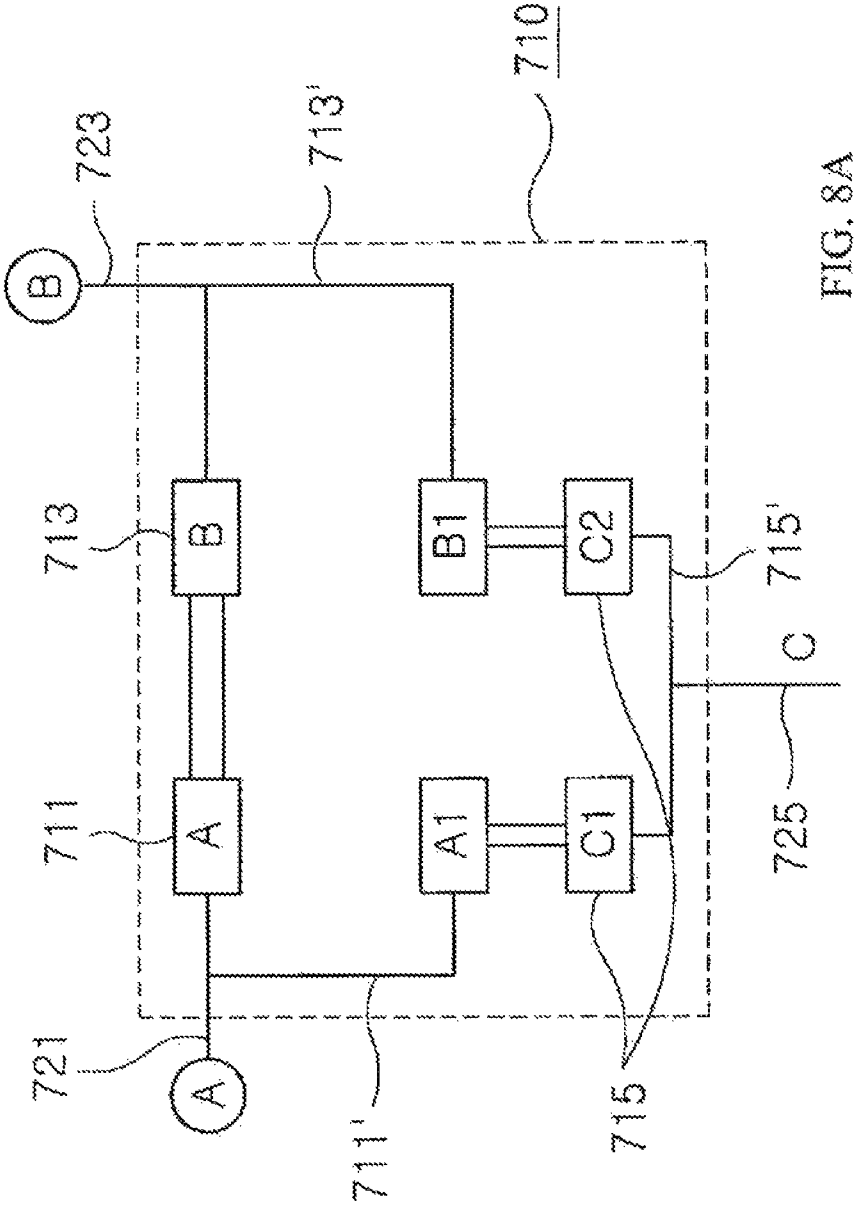
FIG. 8A PRIOR ART
FIGS. 8A and 8B are views illustrating a configuration and operation of a conventional connector.
Figure 8B:
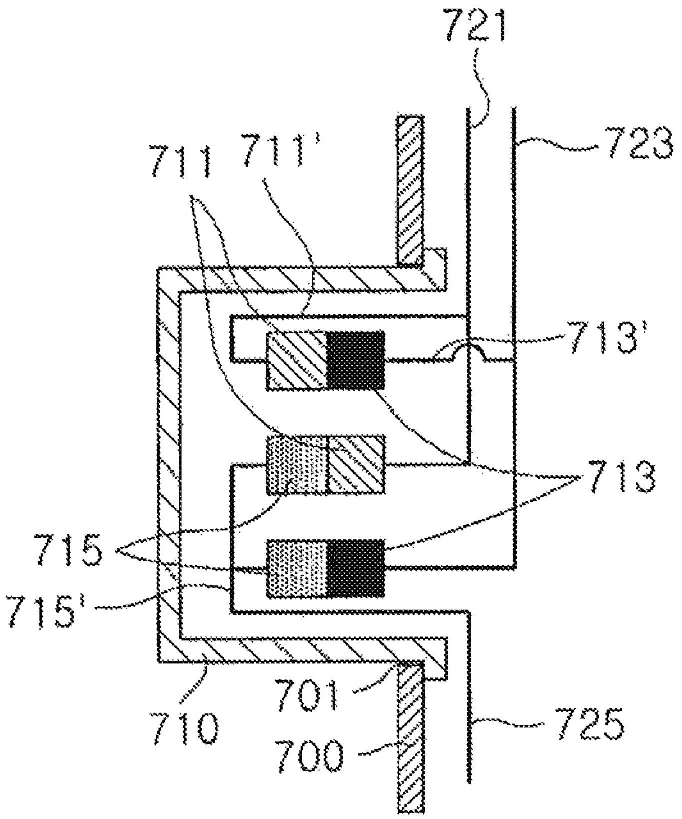
FIG. 8B PRIOR ART

Next, referring to FIG. 6, if the user pivots the lever member 520 to the top of the main body housing 40, the sliding members 510 having the linear toothed portions 513 engaged with the circular toothed portions 523 of the lever member 520 are moved downward as the circular toothed portions 523 of the lever member 520 are rotated along the linear toothed portions 513 of the sliding members 510. In this case, the lever member 520 is pivoted until the first pivoting restraining bosses 23 of the second connector 20 are inserted into the first pivoting restraining holes 525 and the second pivoting restraining bosses 46 of the main body housing 40 are inserted into the second pivoting restraining holes 527, thereby functioning to guide a downward movement position of the sliding members 510.

With the above described operation, the terminal protecting member 600 and the first and second connectors 10 and 20 are moved downward into the first and second connector receptacles 100 and 200 so that the first and second connection terminals 10' and 20' of the first and second connectors 10 and 20 are inserted into the holes 601 of the terminal protecting member 600 without a risk of damage and simultaneously, are directly connected to the third connection terminals 30' of the third connectors 30. In addition, the circuit board connection terminals 411 of the circuit board 410 are connected to the connection terminals 10' and 20' of the first and second connectors 10 and 20.

In this way, the first and second connectors 10 and 20 are electrically connected to each other by the circuit board 410, and electrical connection between the first connector 10 and the third connector 30 and electrical connection between the second connector 20 and the third connector 30 are realized by the respective connection terminals 10', 20' and 30'.

As described above, the main body housing 40 of the joint connector assembly 1, in which the respective connectors 10, 20 and 30 are electrically connected to one another, may be attached to the target mount surface of the vehicle body frame by the bracket 50, or may be directly attached to the mounting surface of the vehicle body frame.

For example, first, second and third lines 19, 29 and 39, which are connected respectively to the first, second and third connectors 10, 20 and 30 of the joint connector assembly 1 may have an arrangement as illustrated in FIG. 1, which results in easier installation of the joint connector assembly 1 and a reduction in the volume of the installed joint connector assembly 1.

The present invention is applicable to a joint connector assembly used in power circuits of a variety of electric and electronic appliances, such as washing machines, refrigerators, vehicles and the like.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A joint connector assembly comprising:

a circuit board;

first and second connectors connected to each other by circuit board connection terminals positioned on the circuit board; and third connectors located adjacent to the first and second connectors; the first connector being connected to one of the third connectors through a first connection terminal and a third connection terminal, and the second connector being connected to another of the third connectors through a second connection terminal and another third connection terminal, such that the first, second, and third connection terminals are positioned independent from the circuit board, being spaced a distance therefrom.

2. The joint connector assembly according to claim 1, wherein the circuit board is located below the first and second connectors and is mounted on the third connectors.

3. The joint connector assembly according to claim 1, wherein: the first and second connectors are located in an upper region of a main body housing and the third connectors are integrally formed with the main body housing so as to be located in a lower region of the main body housing; the upper region of the main body housing defines first and second connector receptacles in which the first and second connectors are installed respectively; and the circuit board is mounted at the center of the third connectors below the first and second connectors.

4. The joint connector assembly according to claim 3, further comprises a cover member attached to a lower surface of the circuit board so as to cover the circuit board.

5. The joint connector assembly according to claim 3, further comprising a terminal protecting member mounted in the main body housing to protect the connection terminals.

6. The joint connector assembly according to claim 3, wherein the main body housing is provided with a connector coupling unit, which serves to insert the first and second connectors into the first and second connector receptacles so as to allow the first and second connectors to be coupled to the respective third connectors.

7. The joint connector assembly according to claim 6, wherein the connector coupling unit includes: sliding members provided at both lateral sides of the main body housing and having protrusions formed at upper ends thereof so as to be inserted into recesses formed in both lateral ends of the first and second connectors, the sliding members serving to insert the first and second connectors into the upper region of the main body housing; and a lever member having both ends engaged with lower ends of the sliding members and adapted to be pivoted upward from a front surface of the main body housing.

8. The joint connector assembly according to claim 7, wherein the lower ends of the sliding members are provided with linear toothed portions and both the ends of the lever member are provided with circular toothed portions to be engaged with the linear toothed portions respectively.

9. The joint connector assembly according to claim 3, wherein the main body housing is provided at a rear surface thereof with a mounting surface coupling structure to allow the main body housing to be coupled to a mounting surface of a vehicle body frame.

10. The joint connector assembly according to claim 9, wherein the mounting surface coupling structure includes: a coupling guide formed at the rear surface of the main body housing; and a bracket having a coupling rail, into which the coupling guide is inserted, and a vehicle body frame coupling piece to be coupled to the mounting surface of a vehicle chassis.

11. The joint connector assembly according to claim 9, wherein the mounting surface coupling structure includes a vehicle body frame coupling piece formed at the rear surface of the main body housing to allow the main body housing to be directly coupled to the mounting surface of the vehicle body frame.

12. A joint connector assembly comprising:

first and second connectors being located in an upper region of a housing and having recesses formed in lateral ends thereof;

third connectors integrally formed with a lower region of the housing, disposed adjacent to the first and second connectors and directly connected to the first and second connectors respectively by connection terminals;

a circuit board mounted proximate the center of the third connectors below the first and second connectors, the circuit board connecting the first and second connectors to each other;

first and second connector receptacles disposed in the upper region and receiving the first and second connectors respectively;

a connector coupling unit having sliding members and a lever, the connector coupling unit locating the first and second connectors in the first and second connector receptacles for coupling to the respective third connectors, the sliding members disposed at lateral sides of the housing and having protrusions insertable into the recesses to effect the locating of the first and second connectors; and the lever having ends engaged with lower ends of the sliding members and being adapted to be pivoted upward from a front surface of the housing.

13. The joint connector assembly according to claim 12, wherein the lower ends of the sliding members are provided with linear toothed portions and both the ends of the lever member are provided with circular toothed portions to be engaged with the linear toothed portions respectively.

14. A joint connector assembly comprising:

a main body housing;

first and second connectors connected to each other by a circuit board; and third connectors located adjacent to the first and second connectors and directly connected respectively to the first and second connectors by connection terminals positioned independently from the circuit board, being spaced a distance therefrom; and a connector coupling unit having sliding members provided along opposite lateral sides of the main body housing and having protrusions formed at upper ends thereof so as to be inserted into recesses formed in lateral ends of the first and second connectors to position the first and second connectors into an upper region of the main body housing.

* * * * *